United States Patent [19]

Brasen et al.

[11] Patent Number: 5,349,542

[45] Date of Patent: Sep. 20, 1994

[54] METHOD FOR SIZING WIDTHS OF POWER BUSSES IN INTEGRATED CIRCUITS

[75] Inventors: Daniel R. Brasen, San Jose; Bruce S. Seiler, Fremont, both of Calif.

[73] Assignee: VLSI Technology, Inc., San Jose, Calif.

[21] Appl. No.: 862,095

[22] Filed: Apr. 2, 1992

[51] Int. Cl.$^5$ .................. G06F 15/60; G06F 15/20
[52] U.S. Cl. .................. 364/578; 364/488; 364/490
[58] Field of Search ............... 364/488, 489, 490, 491, 364/578

[56] References Cited

U.S. PATENT DOCUMENTS

| | | | |
|---|---|---|---|
| 4,612,618 | 9/1986 | Pryor et al. | 364/490 |
| 5,210,701 | 5/1993 | Hana et al. | 364/491 |
| 5,231,590 | 7/1993 | Kumar et al. | 364/491 |

OTHER PUBLICATIONS

Khanna et al.; "Analytical Models for Sising of VLSI Power/Ground Nets Under Electromigration, Inductive and Registive Constraints". IEEE Symposium Jun. 11–14, 1991.

Cai; "Multi-Pads, Singles Layer Power Net Routing In VLSI Circuits"; IEEE Conf. Jun. 12–15, 1988.

M. Beardslee et al., "Mosaico: An Integrated Macro-Cell Layout System", *MCNC International Workshop on Placement and Routing*, 1988, Session 6.1.

S. Chowdhury, "Optimum Design of Reliable IC Power Networks Having General Graph Topologies", *Design Automation Conference*, 1989, pp. 787–790.

W-M Dai et al., "BEAR: A New Building–Block Layout System", *Int'l Conference on Computer Aided Design*, 1987, pp. 34–37.

S. Devadas, K. Keutzer, and J. White, "Estimation of Power Dissipation in CMOS Combinational Circuits", *Custom Integrated Circuits Conference*, 1990, pp. 19.7.1–19.7.6.

Don Stark and Mark Horowitz, "Analyzing CMOS Power Supply Networks using Ariel", *25th ACM/IEEE Design Automation Conference*, 1988, paper 30.1, pp. 460–464.

*Primary Examiner*—Ellis B. Ramirez
*Attorney, Agent, or Firm*—Douglas L. Weller

[57] ABSTRACT

Segments within a power network of an integrated circuit are calculated utilizing information generated during design and placement. The performance of logic blocks within the integrated circuit is simulated to obtain an estimated maximum current requirement for each logic block. After obtaining an estimated maximum current requirement for each logic block, the estimated maximum current flow through each power net segment is obtained by summing the estimated current requirements for each logic block which draws current through the power net segment. Based on this estimated maximum current flow through each power segment, a width for each power net segment is calculated. After widths have been calculated, a check may be made to assure that a predetermined electromigration limit is not exceeded. When projected current flow through a power net segment will result in an exceeding of the predetermined electromigration limit, the width of the power net segment is increased.

10 Claims, 6 Drawing Sheets

METHOD FOR SIZING WIDTHS OF POWER BUSSES IN INTEGRATED CIRCUITS

BACKGROUND

The present invention concerns a method for generating widths for segments of power busses (nets) in integrated circuits.

Within an integrated circuit, power nets are used to provide current to logical circuitry. Power nets are networks of wires which carry a power voltage or a ground voltage to the logical circuitry of an integrated circuit. When placing and sizing power nets, it is desirable to minimize the space the power nets use on the integrated circuit. However, it is also necessary that the power nets provide sufficient current so that during switching of logic circuitry, the voltage on the power nets will remain within a designated voltage range. Further, the power nets must be of significant width so that electromigration does not affect circuit performance.

Power routers are used to route power nets on an integrated circuit. For examples of existing power routers, see M. Beardslee, J. Burns, A Casotto, M. Igusa, F. Romeo, and A. Sangiovanni-Vincentelli, *Mosaico: An Integrated Macro-Cell Layout System*, MCNC International Workshop on Placement and Routing, 1988, Session 6.1; S. Chowdhury, *Optimum Design of Reliable IC Power Networks Having General Graph Topologies*, Design Automation Conference, 1989, pp. 787–790; or W-M Dai, H. H. Chen, R. Dutta, M. Jackson, E. S. Kuh, M. Marek-Sadowska, M. Sato, D. Wang, and X-M Xiong, *BEAR: A New Building-Block Layout System*, Int'l Conference on Computer Aided Design, 1987, pp. 34–37. Modern technologies, however, continue to allow the design of larger integrated circuits with increasingly higher gate densities, faster operating frequencies and have higher power dissipation. Since power nets often occupy more than ten percent of available circuit area, it is desirable to develop techniques which allow reduction in the size of power nets without sacrificing circuit performance.

SUMMARY OF THE INVENTION

In accordance with the preferred embodiment of the present invention, a method is presented for calculating widths of power net segments within a power net of an integrated circuit. The method utilizes information generated during design and placement. For example, the method utilizes a generated logic netlist of the integrated circuit to perform logic level simulation of the integrated circuit. The method also utilizes information pertaining to the grouping of circuit elements during a floorplanning stage, as well as information pertaining to routing of power nets to the logic blocks.

The performance of the logic blocks within the integrated circuit is simulated to obtain an estimated maximum current requirement for each logic block. For example, the simulation includes the use of user generated simulation test vectors. The simulation test vectors are, for example, chosen so as to cause the maximum simultaneous switching of circuit element outputs within each logic block. Performance of each logic block is simulated in response to application of the simulation test vectors to the integrated circuit. From this simulation, a maximum number of circuit element outputs within each logic block which simultaneously switch in response to application of the simulation test vector is determined. The current required to perform the switching of the maximum number of circuit element outputs within a logic block is the estimated maximum current required by the logic block.

After obtaining an estimated maximum current requirement for each logic block, the estimated maximum current flow through each power net segment is obtained by summing the estimated current requirements for each logic block which draws current through the power net segment. Based on this estimated maximum current flow through each power segment, a width for each power net segment is calculated.

For example, the width for each power net segment within a defined portion of the power net may be obtained by performing a nodal analysis within the defined portion of the power net. The nodal analysis utilizes a determined maximum allowable voltage drop within the defined portion of the power net. When performing the nodal analysis, the minimum width for each power net within the defined portion is calculated so that current density is constant for all power net segments within the defined portion, except that all power net segments within a single channel have equal widths. When a plurality of power net segments are in a single channel, the width of the channel is sized so that a power net segment through which the smallest current flows has a current density equal to the current density of channels which are comprised of only a single power net segment.

After widths have been calculated, a check may be made to assure that a predetermined electromigration limit is not exceeded. When projected current flow through a power net segment will result in an exceeding of the predetermined electromigration limit, the width of the power net segment is increased.

The present invention is an improvement over the prior art in that it allows sizing of power net segments based on relatively accurate estimates of maximum current flow through the power net segments.

DESCRIPTION OF THE PREFERRED EMBODIMENT

Figure 1:
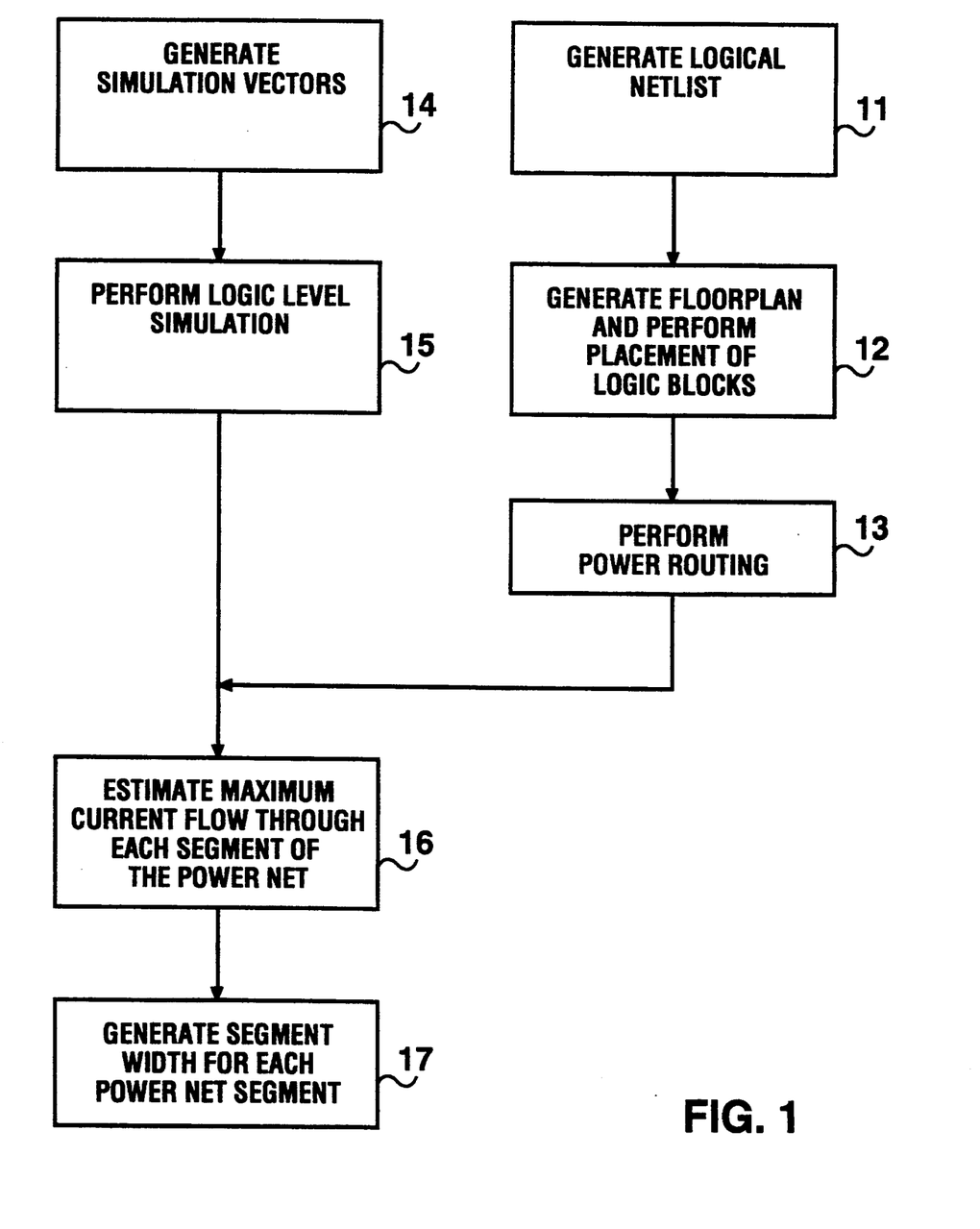
FIG. 1 is a flowchart which provides a description of a method for accurately sizing segment widths of power nets in accordance with the preferred embodiment of the present invention.

FIG. 1 shows a flowchart which provides a description of a method for accurately sizing power net segment widths of power nets in accordance with the preferred embodiment of the present invention. On the right hand side of FIG. 1, there is listed steps which are used in the design of an integrated circuit. In a step 11, a logical netlist is generated. For further information on the generation of logic level netlists, see for example, Stephen M. Trimberger, *An Introduction to CAD for VLSI*, Kluwer Academic Publishers, Boston, 1987, pp. 7, 136.

In a step 12, circuit elements are grouped into logic blocks. Also, a floorplan is generated and the logic blocks of circuit elements are placed. For more information on floor-planning and placement of logic blocks, see for example, D. F. Wong and C. L. Liu, *A New Algorithm for Floorplan Design*, 23rd Design Automation Conference, 1986, pp. 101-107. See also, Charles Ng, Sunil Ashtaputre, Elizabeth Chambers, Kieu-huong Do, Siu-tong Hui, Rajiv Mody, and Dale Wong, *A Hierarchical Floor-Planning, Placement, and Routing Tool for Sea-of-Gates Designs*, Custom Integrated Circuits Conference, IEEE 1989, pp. 3.3.1-3.3.4.

In a step 13, power routing is performed. For examples of the routing of power nets see, Xiao-Ming Xiong and Ernest S. Kuh, *The Scan Line Approach to Power and Ground Routing*, IEEE, 1986; S. Chowdhury, *An Automated Design of Minimum-Area IC Power/Ground Nets*, 24th/ACM/IEEE Design Automation Conference, 1987; and Shinichiro Haruyama and Don Fussell, *A New Area-Efficient Power Routing Algorithm for VLSI Layout*, IEEE, 1987.

On the left hand side of FIG. 1, there is listed steps which are used to size the segment widths of the power nets. In a step 14, simulation (test) vectors are generated for the integrated circuit. The simulation vectors are, for example, generated by a user and are circuit dependent. The simulation vectors are generated so that placement of the simulation vectors on inputs of the integrated circuit will result in a maximum number of circuit element outputs being simultaneously switched (toggled). In a step 15, logic level simulation is performed in order to produce the power requirements for each logic block of the circuit.

Figure 2:
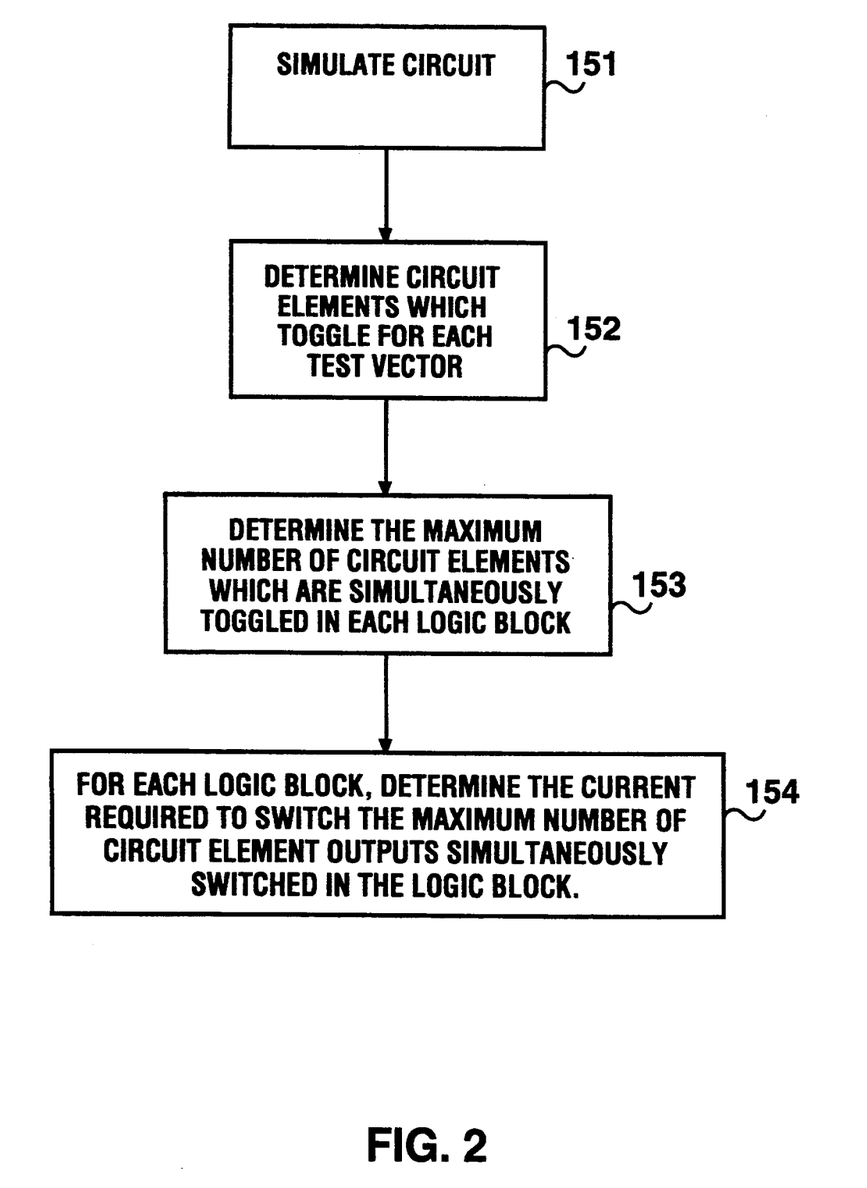
FIG. 2 is a flowchart which provides detail of logic level simulation in accordance with the preferred embodiment of the present invention.

FIG. 2 shows substeps of step 15. In a substep 151, the circuit is modeled using the information in the netlist generated in step 11. In a substep 152, operation of the modeled circuit is monitored in response to application of the simulation vectors generated in step 14. During the monitoring, there is noted the groups of circuit element outputs which switch in response to each simulation vector. In a substep 153, the maximum number of circuit element outputs which are simultaneously switched in each logic block is detected. The circuit elements are grouped into logic blocks as part of step 12.

In a substep 154, for each logic block, the current required to switch the maximum number of simultaneously switched circuit element outputs within the logic block is determined. This is done by summing the current requirements of each of the individual circuit elements. For an example of estimation of current requirements of groups of logic elements, see S. Devadas, K. Keutzer, and J. White, *Estimation of Power Dissipation in CMOS Combinational Circuits*, Custom Integrated Circuits Conference, 1990, pp. 19.7.1-19.7.6.

In a step 16, maximum current flow through each segment of a power net is estimated. This is done using the estimated current requirements for each logic block calculated in step 16. For each segment of the power net, the current requirements for all logic blocks which draw current through the power net segment are summed to provide the estimated maximum current flow through the power net segment.

In a step 17, power net segment widths are generated for each power net segment. The method for such calculations is illustrated by FIG. 3, FIG. 4, FIG. 5 and FIG. 6.

Figure 3:
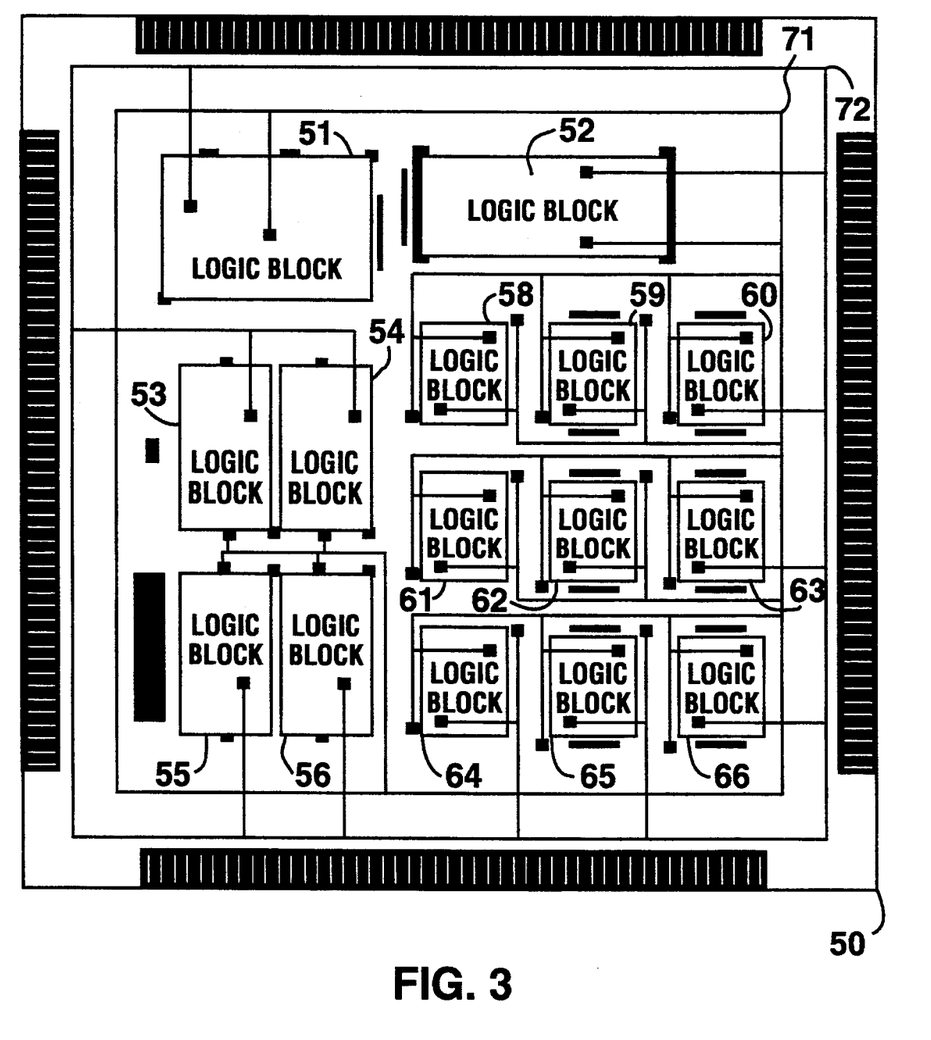
FIG. 3 shows a simplified logic block diagram of an integrated circuit.

FIG. 3 shows a floorplan of an integrated circuit 50. Circuit elements of integrated circuit 50 have been divided into logic blocks. Integrated circuit 50 is shown to include a logic block 51 which includes circuit elements which are grouped into delay chains which form ring oscillators. Integrated circuit 50 also includes a logic block 52 which is, for example a cell instance area, that is, a block of standard cells. Also within integrated circuit 50 are a logic block 53, a logic block 54, a logic block 55 and a logic block 56. Logic block 53, logic block 54, logic block 55 and logic block 56 each function as a random access memory (RAM). Additionally, integrated circuit 50 includes a logic block of standard cells 57, a logic block of standard cells 58, a logic block of standard cells 59, a logic block of standard cells 61, a logic block of standard cells 62, a logic block of standard cells 63, a logic block of standard cells 64, a logic block of standard cells 65 and a logic block of standard cells 66. A power net 71 and a power net 72 are routed to each logic block as shown. For example, power net 71 is a VSS power net.

Figure 4:
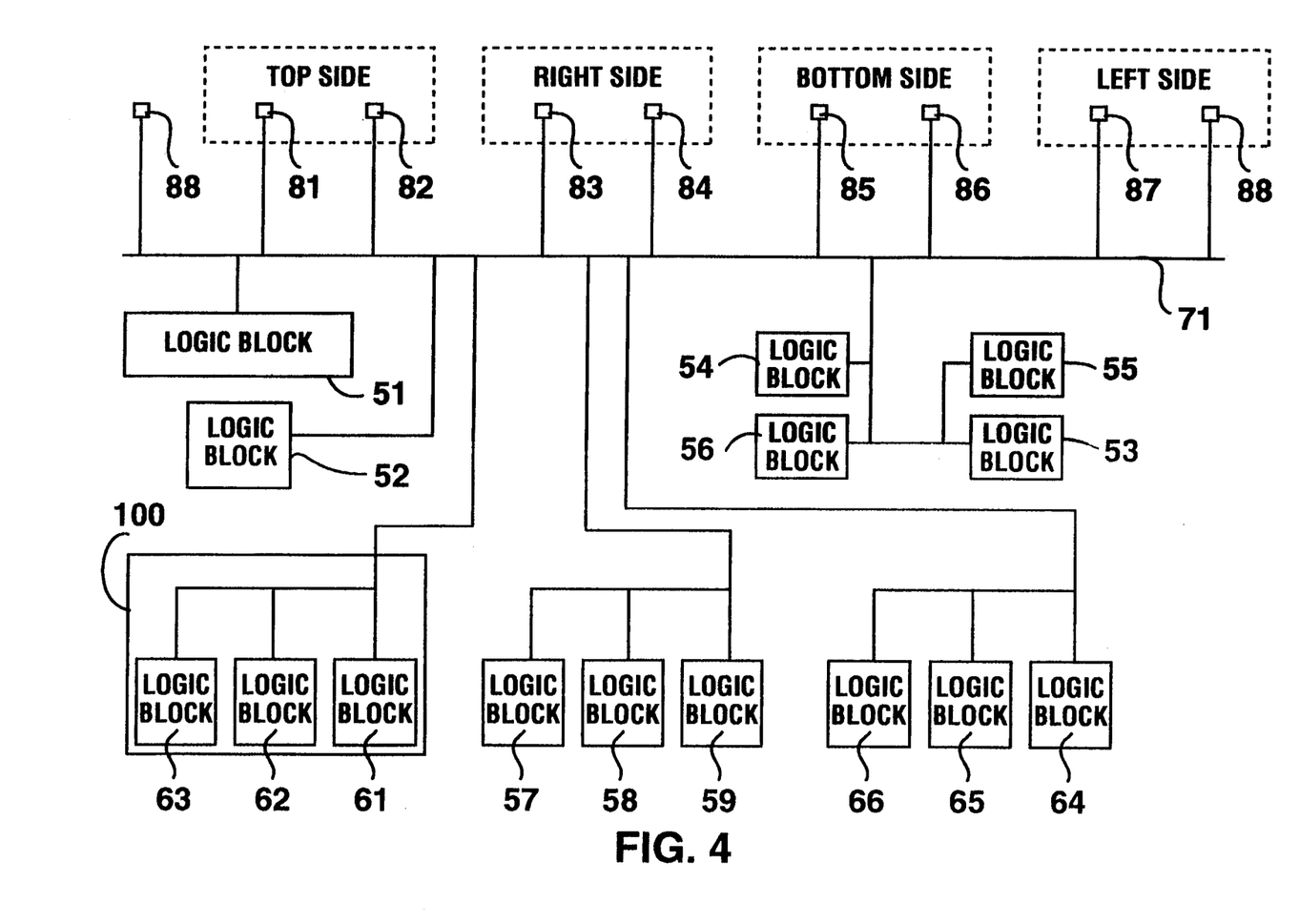
FIG. 4 shows a routed topology graph of the power routing for the integrated circuit shown in FIG. 3 in accordance with the preferred embodiment of the present invention.

In order to show current flow through the power nets to each logic block, a graph of the routed topology of each power net is constructed. Such a graph for VSS power net 71 is shown in FIG. 4. In FIG. 4, a power pad 81, a power pad 82, a power pad 83, a power pad 84, a power pad 85, a power pad 86, a power pad 87 and a power pad 88 are shown. Power pads 81 through 88 are placed on the outside edges of integrated circuit 50. As indicated in FIG. 4, power pads 81 and 82 are on the top side of integrated circuit 50. Power pads 83 and 84 are on the right side of integrated circuit 50. Power pads 85 and 86 are on the bottom side of integrated circuit 50. Power pads 87 and 88 are on the left side of integrated circuit 50. Power pads 81 through 88 are routed to power net 71. In the graph shown in FIG. 4, power pad 88 is shown twice, indicating that power net 71 is connected in a ring.

The graph of the routed topology, shown in FIG. 4, is used to estimate the maximum current flow through power net segments which form power net 71. In doing this node voltages are assigned to power pads 81 through 88, and to various of logic blocks 51 through 59, and 61 through 66. The required current distribution through the power net segments may then be calculated based on the assigned node voltages. The width of each power net segment is determined based on the current distribution.

In the preferred embodiment, to simplify calculations, integrated circuit 50 is designed so that total current required is divided equally among power pads 81 through 88. The current density within each power net segment is assumed to be equal, with one exception. The exception is that power net segments in a single channel (i.e. those connected in a single line), are not required to have the same current density. This is because, requiring power net segments in a single channel to have the same channel density would result in tapering the width of the channel. Tapering the width of channels would result in dead space in the floorplan that cannot be used by signal routing. Therefore, in a single channel, the power net segment with the smallest current flow is chosen as the power net segment which will have the same current density as other power net segments. This will save area on integrated circuit 50, but will increase the current density of the power net segment in a channel with the largest current to a level above the current density of other power net segments. These larger current densities are acceptable as long as the increased current density is not so high that it exceeds a predetermined electromigration limit.

The calculations necessary to solve a routed topology graph the size of that shown in FIG. 4 are complex. However, the method may be illustrated by showing calculations for a portion 100 of integrated circuit 50.

Figure 5:
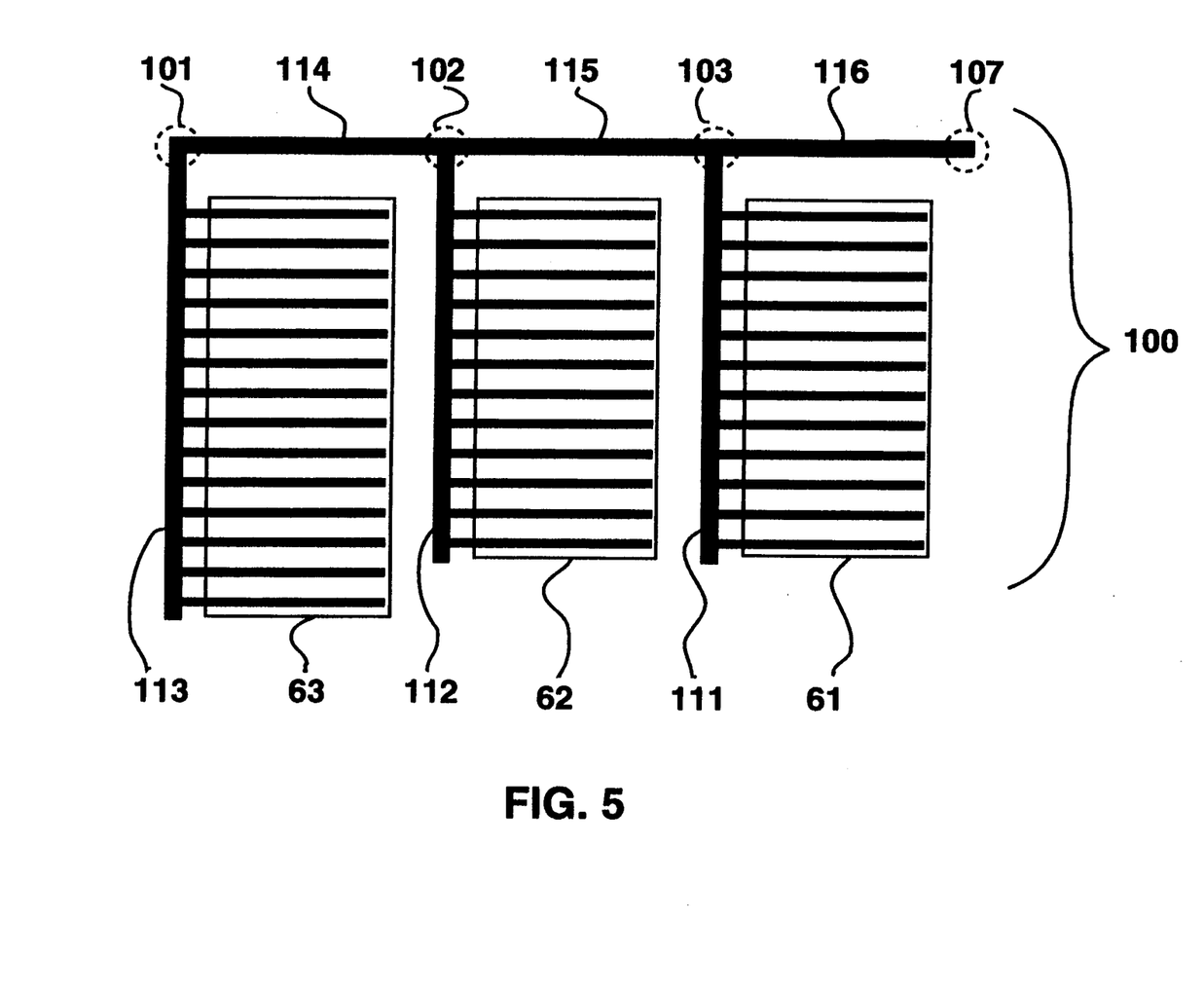
FIG. 5 shows additional detail of a portion of the simplified logic block diagram shown in FIG. 3 in accordance with the preferred embodiment of the present invention.

In FIG. 5, portion 100 is shown to be composed of logic block 61, logic block 62 and logic block 63. A power net segment 111 provides current to logic block 61, as shown. A power net segment 112 provides current to logic block 62, as shown. A power net segment 113 provides current to logic block 63, as shown. A power net segment 114 connects power net segment 113 to power net segment 112. A power net segment 115 connects power net segment 112 to power net segment 111. A power net segment 116 connects portion 100 to the remainder of integrated circuit 150. Also in FIG. 5, the locations of a node 104, a node 105, a node 106 and a node 107 are as shown.

For the sample calculation, the following example values are used. The maximum allowable voltage drop due to interconnect for average power is 100 millivolts (mV). Half of this value (50 mV), may be lost within portion 100. That leaves room for a possible 50 mV power drop between one of power pads 81–88, to portion 100. Sheet resistance ($R_s$) within the power net segments is, for example, 46 milliohms (m$\Omega$) per square. The resistance through a power net segment is equal to the sheet resistance times the length of the power net segment divided by the width of the power net segment ($R_s*L/W$). The electromigration limit is 11 milliamperes (mA) per $\mu$m at room temperature.

For this example, it is presumed that in step 15, the estimated current requirement for logic block 63 was found to be 18 mA. The estimated current requirement for logic block 62 was found to be 15 mA. The estimated current requirement for logic block 61 was found to be 15 mA. In step 16, the current required for each power net segment is calculated by summing the current requirement for each block which receives current through the power net segment. For ease of representation, the following notation is used: $I_1$ represents the current through power net segment 111. $I_2$ represents the current through power net segment 112. $I_3$ represents the current through power net segment 113. $I_4$ represents the current through power net segment 114. $I_5$ represents the current through power net segment 115. $I_6$ represents the current through power net segment 116. The results of summing the current requirement for each block which receives current through the power net segment yields the following values presented in Table 1 below:

TABLE 1

$I_1$ = 15 mA
$I_2$ = 15 mA
$I_3$ = 18 mA
$I_4$ = $I_3$
= 18 mA
$I_5$ = $I_3$ + $I_4$

TABLE 1-continued

= 33 mA
$I_6$ = $I_5$ + $I_1$
= 48 mA

From the floorplan generated in step 12, and the power routing performed in step 13, the length of each power net segment may be obtained. For example, the length ($L_3$) of power net segment 113 is 70.4 mils. The length ($L_2$) of power net segment 112 is 60.16 mils. The length ($L_1$) of power net segment 111 is 60.16 mils. The length ($L_4$) of power net segment 114 is 33.28 mils. The length ($L_5$) of power net segment 115 is 33.28 mils. The length ($L_6$) of power net segment 116 is 33.28 mils.

Figure 6:
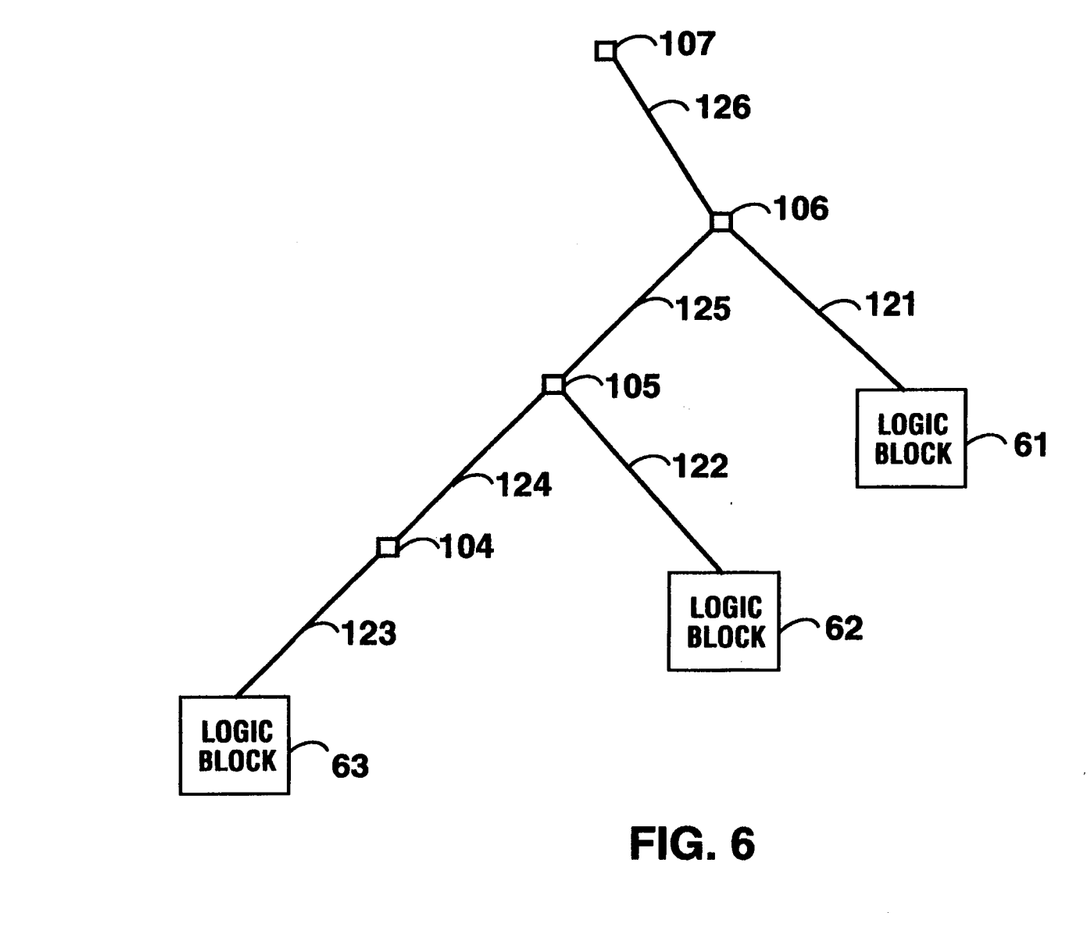
FIG. 6 shows a routed topology graph of a portion, shown in FIG. 5, of the simplified block diagram in accordance with the preferred embodiment of the present invention.

FIG. 6 shows a routed topology graph of portion 100 of integrated circuit 50. This is used to simplify calculations. In the routed topology graph, logic blocks 61, 62 and 63 are treated as voltage nodes. Current flows between the voltage nodes on branches. For example, a branch 121 represents power net segment 111, a branch 122 represents power net segment 112, a branch 123 represents power net segment 113, a branch 124 represents power net segment 114, a branch 125 represents power net segment 115 and a branch 126 represents power net segment 116. In the following calculations, $W_1$ represents the width of power net segment 111. $W_2$ represents the width of power net segment 112. $W_3$ represents the width of power net segment 113. $W_4$ represents the width of power net segment 114. $W_5$ represents the width of power net segment 115. $W_6$ represents the width of power net segment 116.

From the floorplan generated in step 12 and the power routing performed in step 13, the results of which are represented by the block diagram shown in FIG. 5, it is seen that power net segment 114, power net segment 115 and power net segment 116 are all in a single channel. Therefore the widths of these power net segments are all equal. This is expressed by the following Equation 1:

$$W_4 = W_5 = W_6 \qquad \text{Equation 1}$$

As discussed above, the current density within all power net segments is the same, except for the power net segments which are in a single channel. Current density may be expressed as current through a power net segment divided by the width of the power net segment. In the channel which contains power net segment 114, power net segment 115 and power net segment 116, power net segment 114 will have the least current. Therefore, the relationship of current density may be expressed by the following Equation 2:

$$I_1/W_1 = I_2/W_2 = I_3/W_3 = I_4/W_4 \qquad \text{Equation 2}$$

Using Equations 1 and 2, the values given above for $I_1$, $I_2$ and $I_3$, and the observation that $I_3 = I_4$, the widths may all be given in terms of $W_1$, as in Table 2 below:

TABLE 2

$W_2$ = $W_1$
$W_3$ = 1.2 * $W_1$
$W_4$ = 1.2 * $W_1$
$W_5$ = 1.2 * $W_1$
$W_6$ = 1.2 * $W_1$

Since logic block 63 requires the most current and is the farthest away from node 107, it is assumed that the maximum voltage drop in portion 100 is between logic block 63 and node 107. Therefore, for the purposes of calculating minimum widths for the power net segments, the voltage ($V_7$) at node is 0 volts and the voltage ($V_3$) at logic block 63 is 50 mV.

The following Equation 3, can now be used to calculate $W_1$:

$$V_3 = R_s*((I_3*L_3/W_3)+(I_4*L_4/W_4)+(I_5L_5/W_5)+(I_6*L_6/W_6)) \quad \text{Equation 3}$$

Substituting the values for widths $W_3$, $W_4$, $W_5$ and $W_6$, in Table 2, and solving for $W_1$ yields the following Equation 4:

$$W_1 = (R_s/V_3)*((I_3*L_3)+(I_4*L_4)+(I_5*L_5)+(I_6*L_6))/\tfrac{1}{2} \quad \text{Equation 4}$$

Substituting in the values given above for the equation variables yields a width $W_1$ equal to 4.07 mils. From Table 2, the other widths may be calculated to obtain the values in Table 3 below:

TABLE 3

| |
|---|
| $W_2$ = 4.07 mils |
| $W_3$ = 4.07 mils |
| $W_4$ = 4.88 mils |
| $W_5$ = 4.88 mils |
| $W_6$ = 4.88 mils |

Using the values in Table 3, the voltage drop between each node may be calculated to yield the voltage values in Table 4 below. In Table 4, $V_1$ represents the node voltage at logic block 61, $V_2$ represents the node voltage at logic block 62, $V_4$ represents the node voltage at node 104 and $V_5$ represents the node voltage at node 105.

TABLE 4

| |
|---|
| $V_1$ = 30.4 mV |
| $V_2$ = 43 mV |
| $V_4$ = 38 mV |
| $V_5$ = 31.13 mV |
| $V_6$ = 18.45 mV |

The calculated values may now be checked to assure that the integrated circuit will operate within the given limits. First, a check is made to see that $V_1$ and $V_2$ are within the 50 mV maximum voltage drop within portion 100. A check with the values in Table indicates they are. Finally, a check needs to be made to see that the current densities are within the electromigration limits. Current density (current/segment width) for power net segments 111, 112, 113, and 114 is 0.145 mA/$\mu$m. Current density for power net segment 115 is 0.277 mA/$\mu$m. Current density for power net segment 116 is 0.387 mA/$\mu$m. These values are all within the 11 mA/$\mu$m limit. When the electromigration limits are exceeded for any power net segment, the width of the power net segment is enlarged.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for sizing widths of power net segments within a power net of an integrated circuit, the method comprising the steps of:
   (a) grouping circuit elements of the integrated circuit into logic blocks;
   (b) routing the power net between the logic blocks;
   (c) simulating performance of the logic blocks within the integrated circuit to obtain an estimated maximum current requirement for each logic block;
   (d) for each power net segment, summing the estimated current requirements for each logic block which draws current through the power net segment to obtain estimated maximum current flow through the power net segment;
   (e) based on maximum current flow in step (d) calculating a width for each power net segment; and,
   (f) sizing the width for each power net segment based on the calculation performed in step (e).

2. A method as in claim 1 wherein step (e) includes the substeps of:
   (e.1) determining maximum allowable voltage drop within a defined portion of the power net; and,
   (e.2) using the maximum allowable voltage drop determined in substep (e.1) and the maximum current flow calculated in step (d) to calculate a minimum width for each power net segment within the defined portion, the minimum width being selected so that current density is constant for all power net segments within the defined portion, except that all power net segments within a single channel have equal widths.

3. A method as in claim 2, wherein in substep (e.2), when a plurality of power net segments are in a single channel, width of the single channel is sized so that a power net segment through which a smallest current flows has a current density equal to current density of channels which are comprised of only a single power net segment.

4. A method as in claim 3 wherein step (e) additionally comprises the following substep:
   (e.3) when projected current flow through a power net segment having a width calculated in substep (e.2) results in an exceeding of a predetermined electromigration limit, increasing the width of the power net segment.

5. A method as in claim 4 wherein substep (e.2) is performed using nodal analysis within the defined portion of the power net.

6. A method for calculating widths of power net segments within a power net of an integrated circuit, the method comprising the steps of:
   (a) simulating performance of logic blocks within the integrated circuit to obtain an estimated maximum current requirement for each logic block, wherein step (a) includes the substeps of
      (a.1) generating simulation test vectors,
      (a.2) simulating performance of each logic block in response to application of the simulation test vectors to the integrated circuit, and
      (a.3) determining a maximum number of circuit element outputs within each logic block which simultaneously switch in response to application of the simulation test vector;
   (b) for each power net segment, summing the estimated current requirements for each logic block which draws current through the power net segment to obtain estimated maximum current flow through the power net segment; and (c) based on maximum current flow in step (b) calculating a width for each power net segment.

7. A method as in claim 6 wherein step (c) includes the substeps of:
   (c.1) determining maximum allowable voltage drop within a defined portion of the power net; and,
   (c.2) using the maximum allowable voltage drop determined in substep (c.1) and the maximum current flow calculated in step (b) to calculate a minimum width for each power net segment within the defined portion, the minimum width being selected so that current density is constant for all power net segments within the defined portion, except that all power net segments within a single channel have equal widths.

8. A method as in claim 7, wherein in substep (c.2), when a plurality of power net segments are in a single channel, width of the single channel is sized so that a power net segment through which a smallest current flows has a current density equal to current density of channels which are comprised of only a single power net segment.

9. A method as in claim 8 wherein step (c) additionally comprises the following substep:
   (c.3) when projected current flow through a power net segment having a width calculated in substep (c.2) results in an exceeding of a predetermined electromigration limit, increasing the width of the power net segment.

10. A method as in claim 7 wherein substep (c.2) is performed using nodal analysis within the defined portion of the power net.

* * * * *